(12) United States Patent  
Repplinger et al.

(10) Patent No.: US 6,545,855 B1  
(45) Date of Patent: Apr. 8, 2003

(54) LOW INDUCTANCE TERMINATION FOR ELECTRONIC COMPONENTS

(75) Inventors: Scott W. Repplinger, Lake Zurich, IL (US); Jiri Slaby, Buffalo Grove, IL (US); Christopher J. Hoyle, Evanston, IL (US); Brian Lau, Chicago, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/004,554

(22) Filed: Dec. 3, 2001

(51) Int. Cl.$^7$ .............................. H01G 2/20; H01G 4/20
(52) U.S. Cl. ..................... 361/308.1; 361/520
(58) Field of Search ................. 361/517–520, 361/306.1, 308.1, 765, 766

(56) References Cited

U.S. PATENT DOCUMENTS

| | | |
|---|---|---|
| 5,398,169 A | 3/1995 | Gorenz, Jr. et al. |
| 5,537,294 A | 7/1996 | Siwinski |
| 5,608,611 A | 3/1997 | Szudarek et al. |
| 5,729,450 A | 3/1998 | Dimino et al. |
| 6,019,616 A | 2/2000 | Yagi et al. |
| 6,151,221 A | 11/2000 | Van Lerberghe |

*Primary Examiner*—Chau N. Nguyen
*Assistant Examiner*—Eric Thomas
(74) *Attorney, Agent, or Firm*—S. Kevin Pickens; Kevin D. Wills

(57) ABSTRACT

An apparatus (100) for reducing inductance in a capacitor having a first terminal (12) and a spaced-apart second terminal (14), includes a first conductive plate (120) and a second conductive plate (140). The first conductive plate (120) is electrically coupled to the first terminal (12). The second conductive plate (140) is electrically coupled to the second terminal (14) and is disposed in parallel with the first conductive plate (120) so as to overlap at least a portion of the first conductive plate (120). An insulating member (122 and 142) is disposed between the first conductive plate (120) and the second conductive plate (140). The insulating member (122 and 142) insulates the first conductive plate (120) from the second conductive plate (140).

4 Claims, 2 Drawing Sheets

LOW INDUCTANCE TERMINATION FOR ELECTRONIC COMPONENTS

BACKGROUND OF THE INVENTION

1. Field of the Invention

The present invention relates to electronic circuits and, more specifically, to a low inductance termination for an electronic component.

2. Description of the Prior Art

Typical printed circuit boards include an electrically insulating substrate on which a pattern of electroconductive tracks is provided. A number of these tracks terminate at a contact face situated on the surface of the printed circuit board. Electric components, such as resistors and capacitors, are secured to such contact faces by means of their terminals. Such an electric component may consist of a pair of electroconductive wires that are connected to the contact faces by being soldered thereto.

Such components may take the form of leaded components or of leadless, surface-mountable components (SMD components). When leaded components are used, the leads are customarily passed through the printed circuit board and subsequently secured to one or more contact faces of the printed circuit board by means of a soldered joint. SMD components are often glued to a printed circuit board and then the connection faces of the components are electrically connected to the contact faces of the printed circuit board through wave-soldering.

Typical capacitors that are surface mounted to a circuit board include two wire leads that extend from the capacitor to the contacts on the circuit board. These leads form a current path that adds inductance to the circuit. While the inductance added by a single capacitor might be relatively small, the net impedance and resulting voltage transients in high frequency, high current, switched-mode power conversion applications is significant and can seriously degrade the performance of the overall circuit on the circuit board. Similarly, other electronic components can add inductance as a result of the current paths created by the leads used to connect them to a circuit board.

Therefore, there is a need for a low inductance termination for electronic components, such as capacitors.

DETAILED DESCRIPTION OF THE INVENTION

A preferred embodiment of the invention is now described in detail. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 1:
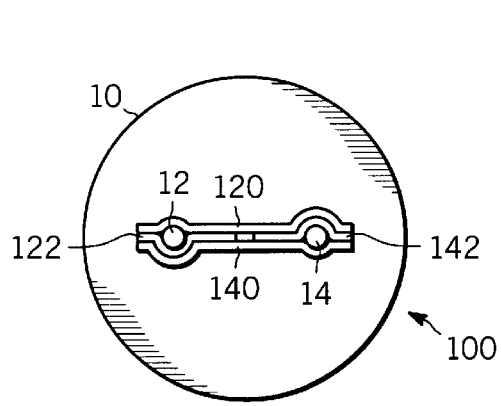
FIG. 1 is a front side elevational view of one embodiment of the invention.
Figure 2:
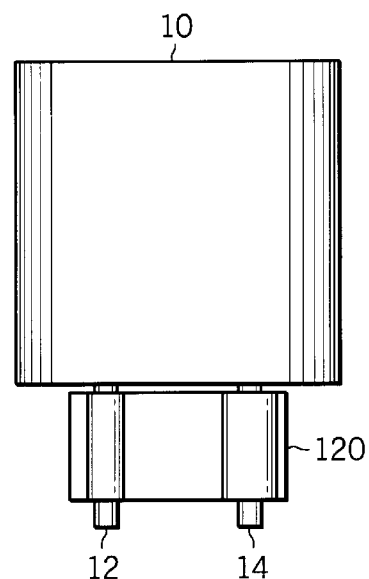
FIG. 2 is a top plan view of the embodiment shown in FIG. 1.
Figure 3:
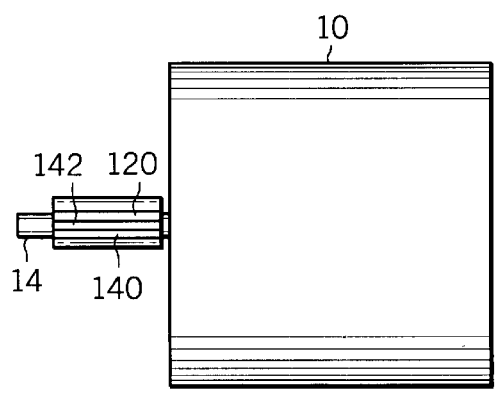
FIG. 3 is a right side elevational view of the embodiment shown in FIG. 1.

As shown in FIGS. 1 through 3, one embodiment of the invention is an apparatus 100 for reducing the lead loop inductance in a capacitor 10 having a first terminal 12 and second terminal 14. A first conductive plate 120 (such as a piece of metal foil) is electrically coupled to the first terminal 12 and a second conductive plate 140 is electrically coupled to the second terminal 14. The second conductive plate 140 is placed in parallel to the first conductive plate 120. By doing this, the loop inductance introduced by the first terminal 12 and the second terminal 14 is substantially reduced. This is because a circular current path no longer exists between the terminals 12 and 14.

Figure 4:
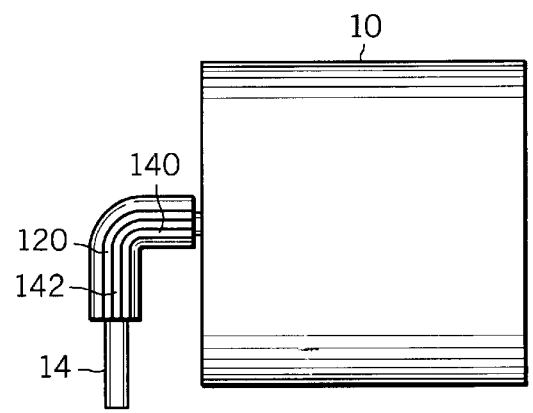
FIG. 4 is a right side elevational view of the embodiment shown in FIG. 1 showing bent leads.

A first layer of a dielectric material 122 may be placed between the first terminal 12 and the second conductive plate 140. Similarly, a second layer of dielectric material 142 is placed between the first conductive plate 120 and the second terminal 14. The layers of dielectric material 122 and 142 form an insulating member and could comprise a dielectric film, of the type commonly used to make capacitors, or could simply be an air gap. In one embodiment, the first conductive plate 120, the second conductive plate 140 and the insulating member could all form part of a circuit board, to which a capacitor is applied. The addition of a dielectric provides the benefit of increasing the capacitance of the capacitor 10. As shown in FIG. 4, this embodiment could allow for the terminals 12 and 14 to be bent down for subsequent mounting to a circuit board.

Figure 5:
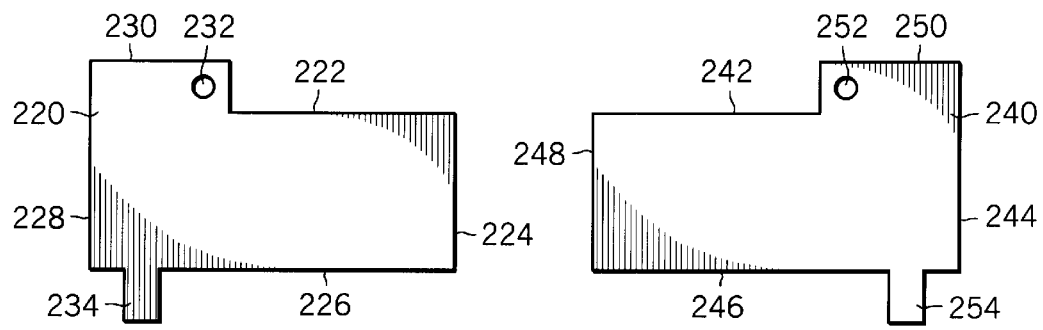
FIG. 5 is an elevational view of two plates according to a second embodiment of the invention.
Figure 6:
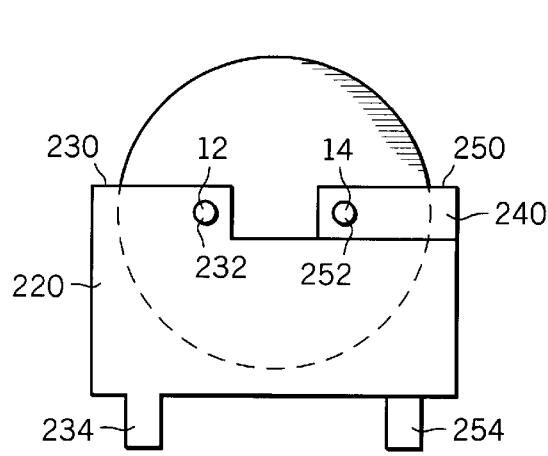
FIG. 6 is an elevational view of the plates shown in FIG. 5 applied to a capacitor.
Figure 7:
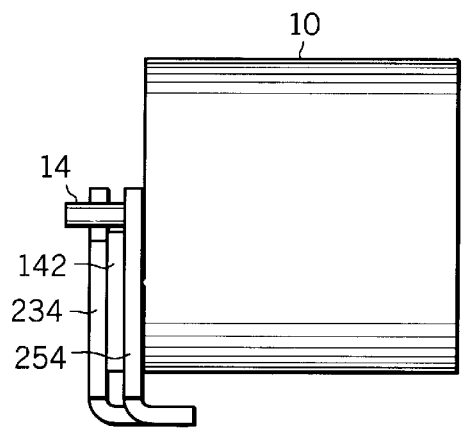
FIG. 7 is a right side elevational view of the embodiment shown in FIG. 6.

In another embodiment of the invention, as shown in FIGS. 5 through 7, the first plate 220 has a top edge 222, a left side edge 228, a right side edge 224 and a bottom edge 226. A first terminal connection tab 230 extends upwardly from the top edge 222 adjacent the left side edge 228. The terminal connection tab 230 defines a hole 232 that passes through the first terminal connection tab 230. The hole 232 is complimentary in size to the first terminal 12 so that the first terminal 12 will fit through the hole. The first terminal 12 may then be soldered to the first terminal connection tab 230. A first wiring board connection tab 234 extends downwardly from the bottom edge 226. When attaching the capacitor 10 to a printed wiring board, the first wiring board connection tab 234 may be bent at a right angle to the first plate 220, thereby creating a flat surface mount attachment stub. Similarly, the first wiring board connection tab 234 may be left straight and may pass through slots in the printed wiring board to allow for wave soldering.

Similar to the first conductive plate 220, a second conductive plate 240 connects to the second terminal 14. The second conductive plate 240 includes a top edge 242, a left side edge 248, a right side edge 244 and a bottom edge 246. A second terminal connection tab 250 extends upwardly from the top edge 242 adjacent the right side edge 244 and defines a hole 252 for connection to the second terminal 14. A second wiring board connection tab 254 extends downwardly from the bottom edge 246 for connection to a printed wiring board.

Figure 8:
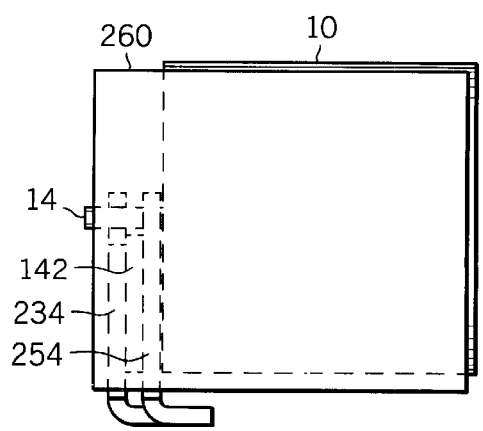
FIG. 8 is a right side elevational view of the embodiment shown in FIG. 6 in which a holder is applied to the components.

As shown in FIG. 8, a holder 260 may be used to hold the capacitor 10, the first conductive plate 220 and the second conductive plate 240 to facilitate easy placement on a circuit board. Such a holder 260 maintains the parallel relationship between the first conductive plate 220 and the second conductive plate 240. Typically, the holder 260 is formed from a plastic and can be a unit into which the capacitor 10 and the plates 220 and 240 are placed, or it can be a plastic that is formed around the capacitor 10, the first conductive plate 220 and the second conductive plate 240 using an injection molding process.

The above described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. An apparatus for reducing inductance in a capacitor having a first terminal and a spaced-apart second terminal, wherein the first terminal and the second terminal have a distance there-between, comprising:
   a first conductive plate that is electrically coupled to the first terminal, wherein the first conductive plate comprises:
   (a) a first plate portion having a top edge, a left side edge, a right side edge and a bottom edge;
   (b) a first terminal connection tab extending upwardly from the top edge adjacent the left side edge, the terminal connection tab defining a hole passing therethrough, the hole complimentary in size to the first terminal so as to be able to receive therein the first terminal; and
   (c) a first wiring board connection tab extending, downwardly from the bottom edge;
   a second conductive plate that is electrically coupled to the second terminal and disposed in parallel with the first conductive plate so as to overlap at least a portion of the first conductive plate, wherein the second conductive plate comprises:
   (a) a second plate portion having a top edge, a left side edge, a right side edge and a bottom edge;
   (b) a second terminal connection tab extending upwardly from the top edge adjacent the right side edge, the terminal connection tab defining a hole passing therethrough, the hole complimentary in size to the second terminal so as to be able to receive therein the second terminal; and
   (c) a second wiring board connection tab extending downwardly from the bottom edge; and
   an insulating member disposed between the first conductive plate and the second conductive plate so as to insulate the first conductive plate from the second conductive plate.

2. The apparatus of claim 1, further comprising a holder, capable of holding the capacitor, the first conductive plate and the second conductive plate so that the first conductive plate is held parallel to the second conductive plate and so that the first terminal extends through the hole defined by the first terminal connection tab and so that the second terminal extends through the hole defined by the second terminal connection tab.

3. The apparatus of claim 2, wherein the holder comprises plastic that has been formed around the capacitor, the first conductive plate and the second conductive plate.

4. The apparatus of claim 3, wherein the plastic comprises injection molded plastic.

* * * * *